(12) United States Patent
Chang et al.

(10) Patent No.: US 9,985,198 B1
(45) Date of Patent: May 29, 2018

(54) HIGH Q QUARTZ-BASED MEMS RESONATORS AND METHODS OF FABRICATING SAME

(71) Applicant: HRL LABORATORIES LLC., Malibu, CA (US)

(72) Inventors: David T. Chang, Calabasas, CA (US); Frederic P. Stratton, Beverly Hills, CA (US); Hung Nguyen, Los Angeles, CA (US); Randall L. Kubena, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 423 days.

(21) Appl. No.: 14/286,419

(22) Filed: May 23, 2014

Related U.S. Application Data

(63) Continuation-in-part of application No. 12/816,292, filed on Jun. 15, 2010, now Pat. No. 8,765,615.

(51) Int. Cl.
*H01L 41/311* (2013.01)
*H01L 41/053* (2006.01)
*H01L 41/047* (2006.01)
*H01L 41/23* (2013.01)
*H01L 41/29* (2013.01)
*H01L 41/332* (2013.01)

(52) U.S. Cl.
CPC ........ *H01L 41/311* (2013.01); *H01L 41/0475* (2013.01); *H01L 41/053* (2013.01); *H01L 41/23* (2013.01); *H01L 41/29* (2013.01); *H01L 41/332* (2013.01)

(58) Field of Classification Search
None
See application file for complete search history.

(56) References Cited

U.S. PATENT DOCUMENTS

| | | | |
|---|---|---|---|
| 5,261,277 | A | 11/1993 | Thomas et al. |
| 5,747,857 | A | 5/1998 | Eda |
| 7,237,315 | B2 | 7/2007 | Kubena et al. |

(Continued)

OTHER PUBLICATIONS

U.S. Appl. No. 12/816,292 (now U.S. Pat. No. 8,765,615), Office Action dated Aug. 9, 2012.

(Continued)

*Primary Examiner* — Shamim Ahmed
*Assistant Examiner* — Bradford M Gates
(74) *Attorney, Agent, or Firm* — Ladas & Parry

(57) ABSTRACT

High-yield fabrication methods are provided for making quartz resonators having thicknesses ranging from one micrometer to several hundred micrometers and thus covering the frequency range from HF to UHF. Plasma dry etching is used to form arbitrary resonator geometries. The quartz resonator structure and the through-quartz vias are formed concurrently. The method includes bonding a quartz device wafer to a quartz handle wafer with a temporary adhesive. Mesa structures formed by plasma dry etching enable the resonators to achieve high-Q operation with energy trapping/mode confinement. A thermo-compression bond integrates the quartz resonators to a host wafer (e.g., an oscillator ASIC) to form oscillators. Silicon cap wafers are bonded over the resonators to the ASIC to provide wafer scale hermetic encapsulation of the quartz oscillators.

25 Claims, 14 Drawing Sheets

(56) References Cited

U.S. PATENT DOCUMENTS

| | | | |
|---|---|---|---|
| 7,647,688 B1 | 1/2010 | Chang et al. | |
| 8,567,041 B1 * | 10/2013 | Roper | H04R 31/00 |
| | | | 216/62 |
| 8,765,615 B1 | 7/2014 | Chang et al. | |
| 2004/0132310 A1 | 7/2004 | Nakatani et al. | |
| 2005/0231078 A1 * | 10/2005 | Tanaka | H03H 9/02086 |
| | | | 310/333 |
| 2007/0017287 A1 | 1/2007 | Kubena et al. | |
| 2007/0086502 A1 * | 4/2007 | Burns | G01L 1/103 |
| | | | 372/92 |
| 2008/0036335 A1 | 2/2008 | Naito et al. | |
| 2008/0073318 A1 * | 3/2008 | Saito | H03H 3/02 |
| | | | 216/17 |
| 2008/0258829 A1 | 10/2008 | Kubena et al. | |
| 2010/0117489 A1 | 5/2010 | Takahashi | |

OTHER PUBLICATIONS

U.S. Appl. No. 12/816,292 (now U.S. Pat. No. 8,765,615), Final Office Action dated Dec. 14, 2012.
U.S. Appl. No. 12/816,292 (now U.S. Pat. No. 8,765,615), Office Action dated Oct. 18, 2013.
U.S. Appl. No. 12/816,292 (now U.S. Pat. No. 8,765,615), Notice of Allowance dated Feb. 24, 2014.
U.S. Appl. No. 15/149,026, filed May 6, 2016, Chang.
U.S. Appl. No. 15/149,026 (filed May 6, 2016; unpublished; non publication requested), Application and Office Actions.
U.S. Appl. No. 15/149,026 (filed May 6, 2016; unpublished; non publication requested), Office Action dated Dec. 13, 2016.
U.S. Appl. No. 15/149,026 (unpublished; non publication requested), Office Action dated Sep. 15, 2017.
U.S. Appl. No. 15/149,026 (filed May 6, 2016; unpublished; non publication requested), Office Action dated Jun. 19, 2017.

\* cited by examiner

HIGH Q QUARTZ-BASED MEMS RESONATORS AND METHODS OF FABRICATING SAME

CROSS-REFERENCE TO RELATED APPLICATIONS

This is a continuation-in-part of U.S. patent application Ser. No. 12/816,292, titled "Quartz-Based MEMS Resonators and Method of Fabricating Same," filed Jun. 15, 2010, incorporated herein by reference.

STATEMENT REGARDING FEDERALLY SPONSORED RESEARCH OR DEVELOPMENT

This invention was made with Government support under Contract No. 20071095726000 awarded by the U.S. Government. The Government has certain rights in the invention.

BACKGROUND

Field

The present technology relates to thickness-shear mode quartz resonators, and more specifically, it relates to high Q quartz-based MEMS resonators operating at HF-UHF band frequencies.

Description of Related Art

A process for manufacturing a quartz-based nanoresonator was provided in U.S. Pat. No. 7,237,315, titled "Method for Fabricating a Resonator," incorporated herein by reference. U.S. Pat. No. 7,237,315 addresses VHF to UHF frequency devices that have less than 10 μm of quartz thickness. FIGS. 1-12 briefly illustrate the prior art sequence of process steps described in the incorporated patent. As shown in FIG. 1, the starting materials include a single-crystal quartz wafer 10, a silicon handle wafer 12 and a host substrate 14. The process begins by defining and etching cavities in a silicon handle wafer. FIG. 2 shows a single cavity 16 etched into silicon handle wafer 12. It is to be understood that batch processing is accomplished by carrying out the processes described herein at a plurality of sites on a wafer. Then, metal (e.g., Al or Au) is deposited onto single-crystal quartz wafer 10 to form top-side electrodes 18 and tuning pad 20, as shown in FIG. 3. Next, the two wafers 10 and 12 are brought together using a direct bonding process, as shown in FIG. 4. After a low temperature bonding/annealing step, a combination of processes including wafer grinding/lapping, chemical-mechanical-planarization (CMP), plasma etching and chemical polishing is used to thin the quartz down to a thickness, typically less than 10 microns, for a desired resonant frequency.

FIG. 5 shows the quartz wafer 10 after it has been thinned. Referring to FIG. 6, photolithography is used to pattern contact via holes 22 in the quartz layer 10. The holes are etched through quartz to stop on the top-side electrode metal and then metalized to form the through-wafer vias. FIG. 6 shows metal 24 in vias 22. FIG. 7 shows the bottom-side electrodes 26 that have been formed by metallization. As shown in FIG. 8, the quartz layer 10 has been patterned and etched to form the resonator 11. FIG. 8 shows a single resonator, but through batch processing, many resonators can be produced simultaneously. FIG. 9 shows a protrusion 28 that remains after material has been etched from the host substrate 14. Metallization patterns 30, including bonding pads, are defined on the substrate 14 as shown in FIG. 10. As illustrated in FIG. 11, the quartz wafer 10/silicon handle 12 pair is bonded to the host wafer 14 using either a Au—Au or Au—In compression bonding scheme. The silicon handle wafer is removed with a combination of dry and wet etches, resulting in the quartz resonator 11 being attached only to the host wafer 14, as shown in FIG. 12. Note that U.S. Pat. No. 7,237,315 uses spin coating of a soft mask (photoresist) for patterning the metal, quartz and silicon structures. Unfortunately, the soft mask cannot be used to form lower frequency devices. A new set of technical challenges is introduced by the much thicker quartz layer. It is desirable to provide techniques for forming resonators covering the frequency range of the prior art and further including the much lower HF range. The lower frequency requires a quartz thickness of greater than 100 Thicker devices require new solutions to bonding, etching and releasing of quartz resonators. The present invention provides such techniques.

SUMMARY

High-yield fabrication methods are provided for making quartz resonators having thicknesses ranging from one micrometer to several hundred micrometers and thus covering the frequency range from HF to UHF. This disclosure teaches techniques for wafer- or chip-scale integration of quartz resonators with electronics to form oscillator circuits. Presently, commercial quartz crystal resonators are fabricated as separate off-chip, discrete components and later added to oscillator application specific integrated circuits (ASICs) in most electronic devices requiring precision timing standards. Thus, the size and cost of the overall unit are significantly increased. U.S. Pat. No. 7,237,315 titled "Method for Fabricating a Resonator," incorporated herein by reference, describes fabrication methods to perform on-chip integration of miniaturized quartz resonators that operate at VHF and UHF frequencies. This disclosure builds on the fundamental concepts of that invention and provides a path for building thick quartz resonators for frequency operation at or below the VHF frequency band. The resonant frequency of a thickness-shear mode quartz resonator is inversely proportional to the quartz layer thickness.

Future development of electronics requiring low-cost, highly integrated precision timing standards can be realized as a result of the present invention. Examples of applications of quartz oscillators include GPS receivers, atomic clocks, radios and phase-lock loop electronics. These examples cover virtually all hand-held wireless electronics. Cell phones and MP3 players are ubiquitous devices that are potential large-volume commercial insertion points for this technology.

The present thickness-shear mode quartz resonator design is suitable for making oscillators with frequencies ranging from HF (3 to 30 MHz) to UHF band (300 MHz to 3 GHz). The fabrication method includes a step of temporary attachment of the quartz device wafer to a quartz handle wafer using adhesive bonding for plasma dry etching. High-Q operation with energy trapping/mode confinement with mesa structures is enabled by plasma dry etching. Batch etching of resonators on a single quartz substrate can yield hundreds of devices per wafer. The via and resonator are concurrently formed in a single plasma dry etch step. Solvent dissolution of an adhesive layer releases and transfers the resonators to a host substrate such as an oscillator ASIC. Direct wafer scale integration of quartz resonators with drive circuitry forms a fully integrated monolithic crystal oscillator and hermetically sealed package to provide stable operation.

Both U.S. Pat. No. 7,237,315 and the present invention use similar MEMS fabrication technology to form the resonator structure. However, due to the vastly different quartz thickness between the UHF and lower frequency devices (several microns compared with several tens or hundreds of microns), the soft (photoresist) mask used in U.S. Pat. No. 7,237,315 can no longer be applied to this invention. This invention also introduces a novel quartz resonator temporary attachment and release technology that can increase device yield and lower cost.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION

Figure 1:
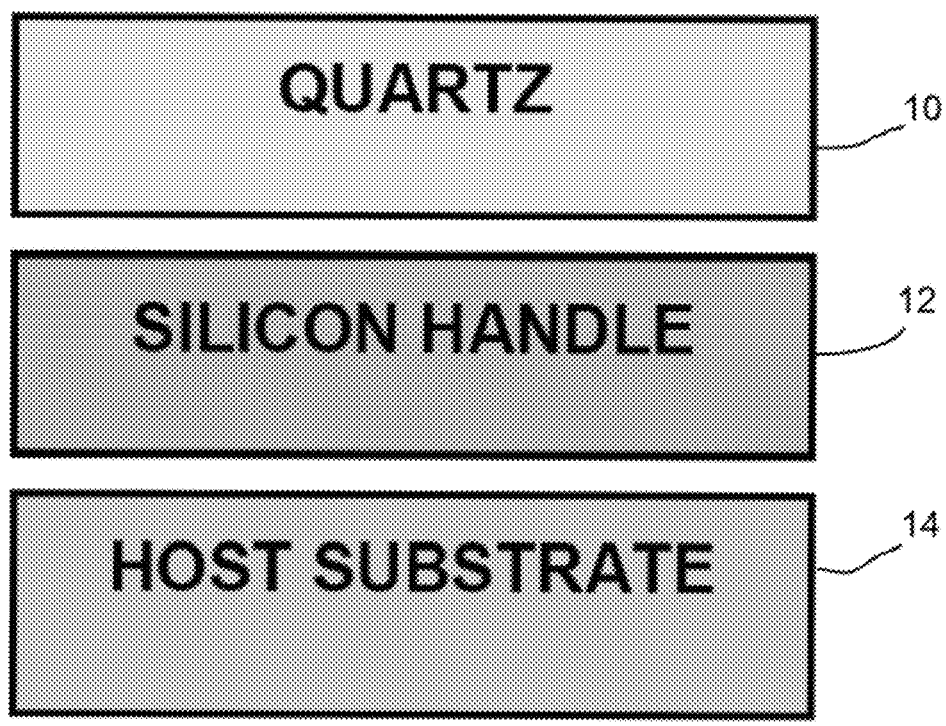
FIG. 1 (prior art) shows the starting materials including a single-crystal quartz wafer, a silicon handle wafer and a host substrate.
Figure 2:
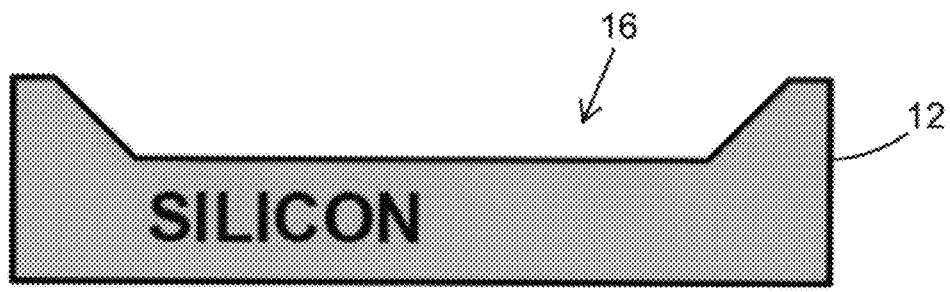
FIG. 2 (prior art) shows a single cavity etched into silicon handle wafer.
Figure 3:
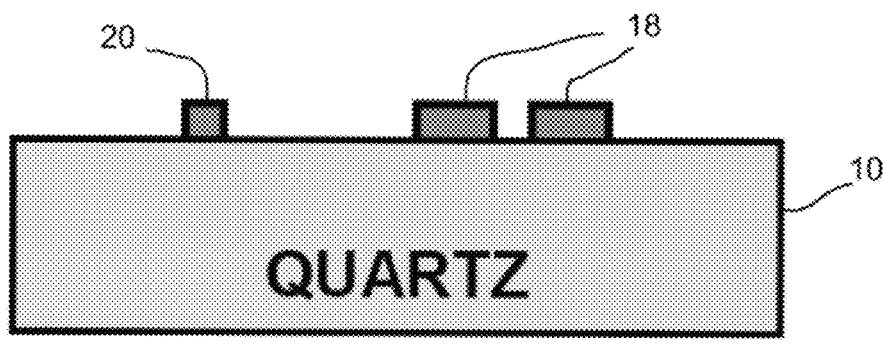
FIG. 3 (prior art) shows metal deposited onto the single-crystal quartz wafer to form top-side electrodes and a tuning pad.
Figure 4:
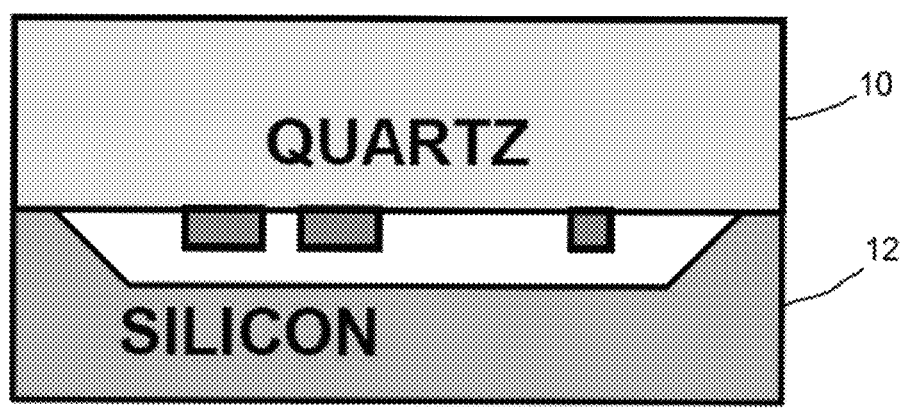
FIG. 4 (prior art) shows the quartz and silicon wafers bonded together.
Figure 5:
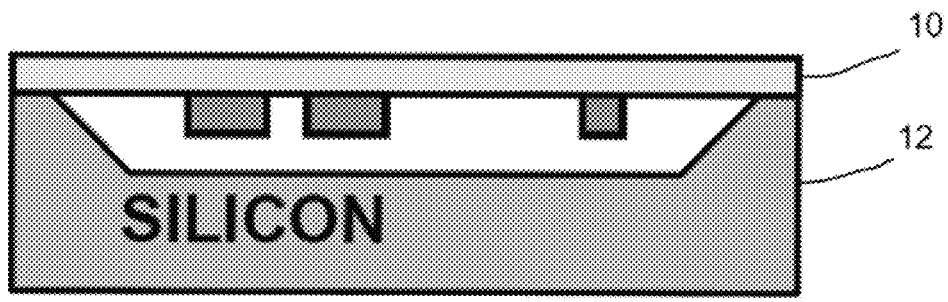
FIG. 5 (prior art) shows the quartz wafer after it has been thinned.
Figure 6:
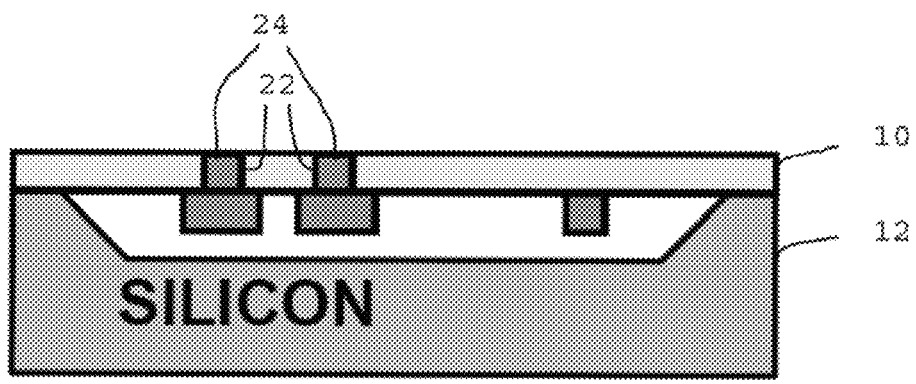
FIG. 6 (prior art) illustrates via holes that have been photolithographically created in the quartz layer.
Figure 7:
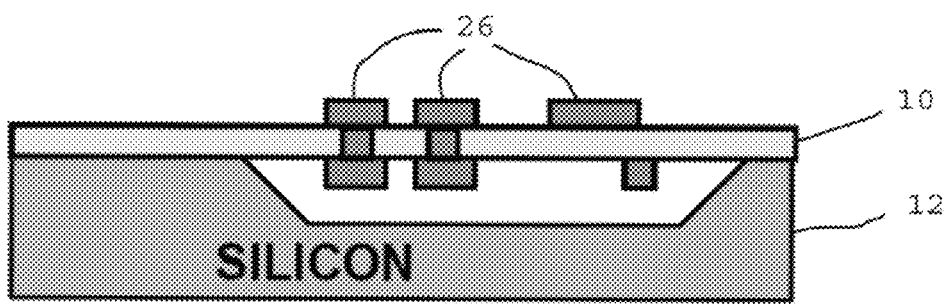
FIG. 7 (prior art) shows the bottom-side electrodes that have been formed by metallization.
Figure 8:
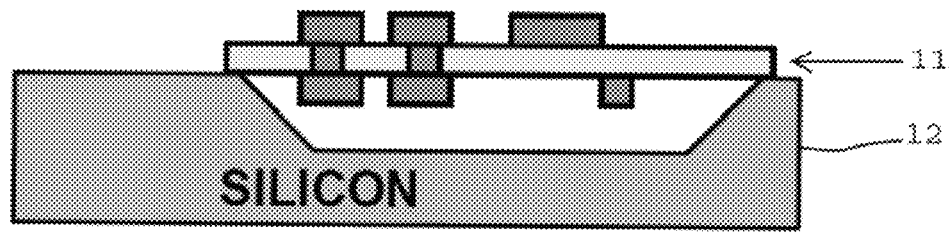
FIG. 8 (prior art) shows the quartz layer 10 patterned and etched to form the resonator.
Figure 9:
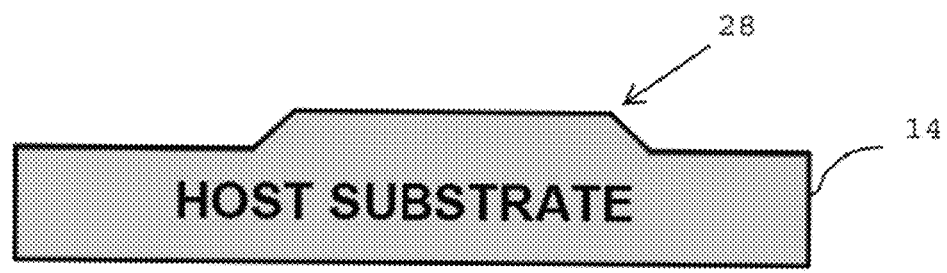
FIG. 9 (prior art) shows a protrusion etched from the host substrate.
Figure 10:
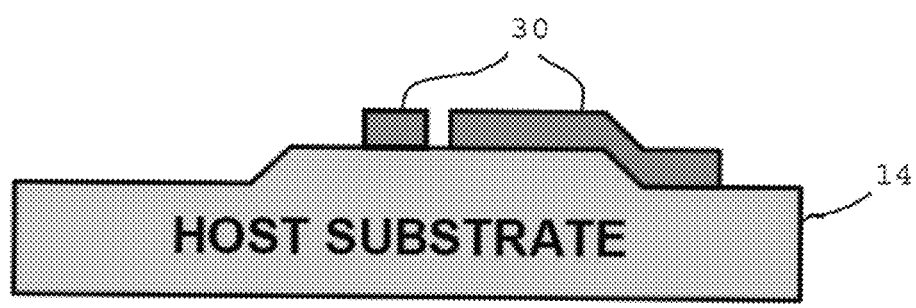
FIG. 10 (prior art) illustrates metallization patterns defined on the host substrate.
Figure 11:
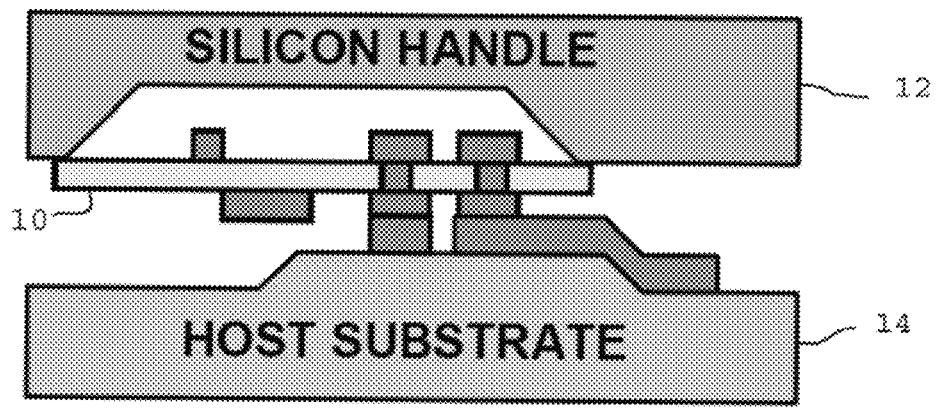
FIG. 11 (prior art) shows the quartz wafer/silicon handle pair bonded to the host wafer.
Figure 12:
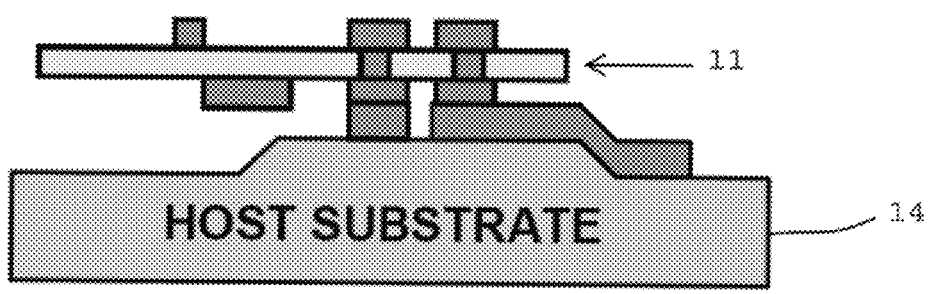
FIG. 12 (prior art) shows the quartz resonator being attached only to the host wafer after the silicon handle wafer has been removed.
Figure 13:
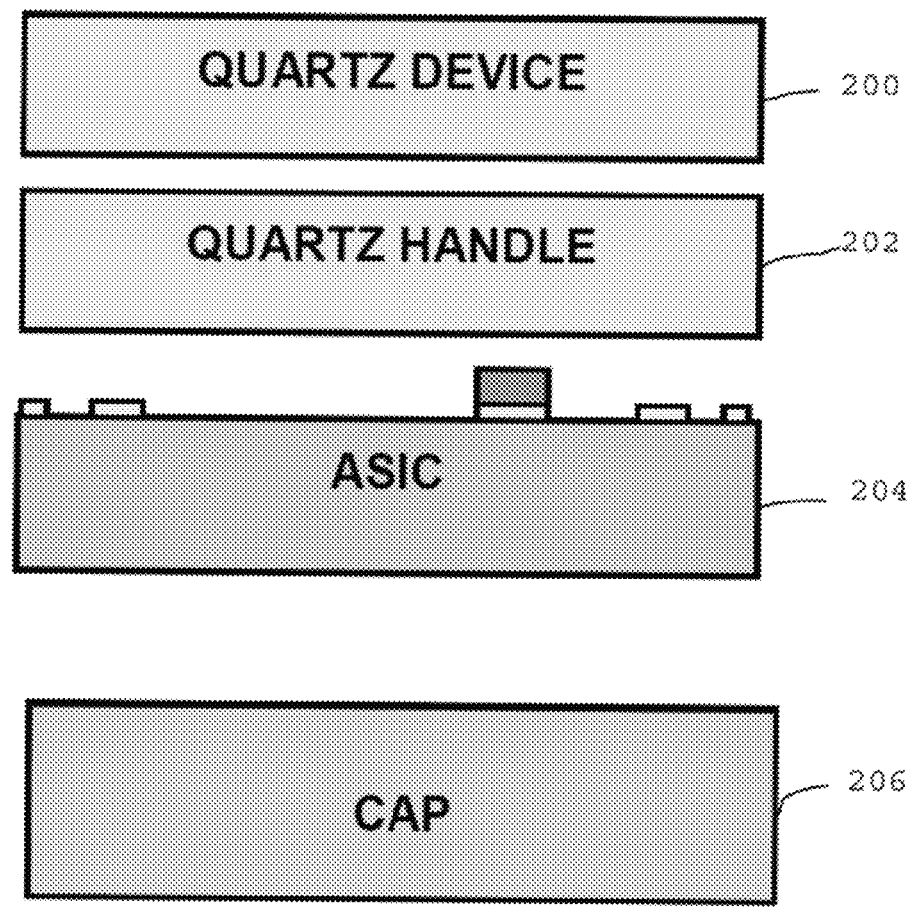
FIG. 13 shows the starting materials of the new process of the present invention as illustrated in FIGS. 13-31, wherein the starting materials include a quartz device wafer, a quartz handle wafer, a host substrate and a silicon cap wafer.

An exemplary fabrication process flow for an integrated quartz oscillator of the present invention is illustrated in cross-section in FIGS. 13-31. The starting materials, as shown in a side view in FIG. 13, consist of a quartz device wafer 200 (for the resonator), a handle wafer 202, a host substrate 204 (such as a silicon CMOS ASIC wafer with oscillator drive circuitry) and a silicon cap wafer 206 for hermetic sealing purpose. A quartz handle wafer is chosen instead of a silicon handle because the quartz handle offers better thermal matching to the quartz device wafer. The specific ASIC host substrate design provided herein is exemplary only and other configurations are within the scope of the present invention. In this embodiment, the handle wafer is made of quartz. In general, it is desirable that the handle wafer is formed of materials that have a coefficient of thermal expansion within a range from 0.5 to 12 ppm/degree C. Exemplary materials include crystalline quartz, fused quartz (amorphous), silicon, gallium arsenide, indium phosphide and sapphire.

Figure 14:
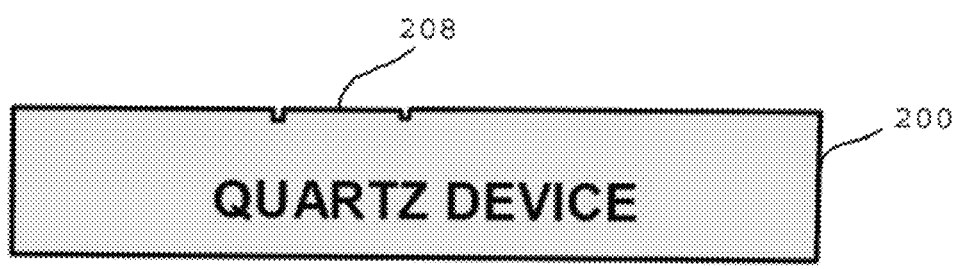
FIG. 14 shows a first step in this exemplary embodiment where a mesa has been etched in to the quartz device.
Figure 20:
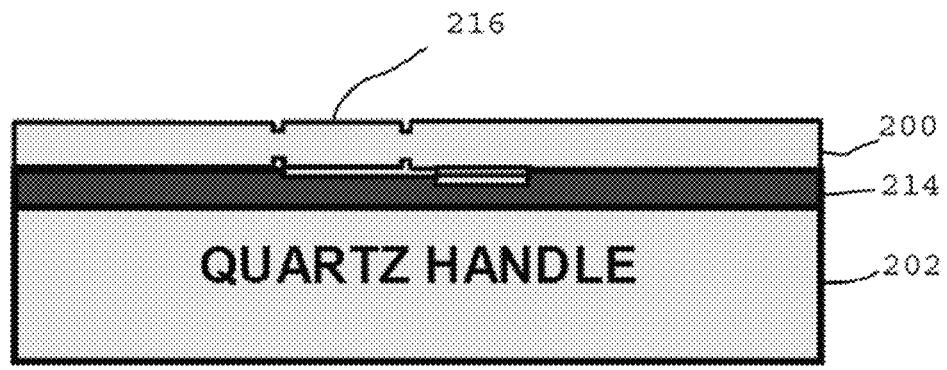
FIG. 20 shows a second mesa structure on the bottom side of the quartz device wafer.
Figure 27:
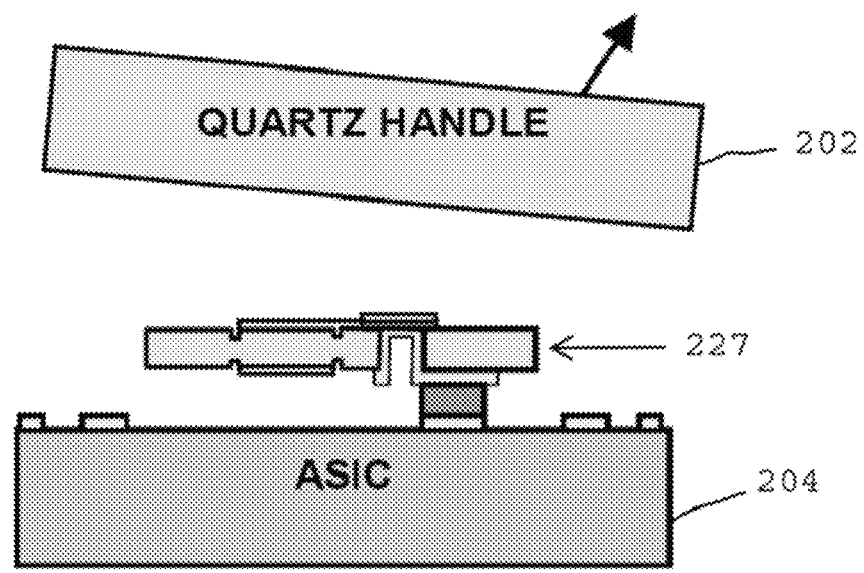
FIG. 27 shows the resonators released from the handle wafer.

Referring to FIG. 14, an embodiment of the process begins with plasma dry etching of quartz to form a groove which in turn defines a mesa 208 on the top side of the quartz device wafer 200. Techniques for plasma dry etching are known in the art. The mesa serves as an energy confinement structure to mitigate dissipation of shear mode energy outside the active area (to be deposited with metal electrodes). The use of the mesa will result in an increase in the quality-factor or 0 factor of the device. The mesa configuration shown in FIG. 14 is merely an example. Other mesa configurations can be used and are within the scope of this invention. In other embodiments, the mesa can have a different geometry or may be completely omitted. In this embodiment, a matching mesa 216 is formed on the opposite side of the quartz device, as shown in FIG. 20. For most embodiments, the specific geometry of the mesa structure formed on one side of the quartz device is matched on the opposite side. In this embodiment, FIG. 27 shows a particular quartz resonator 227 that includes the mesa structure as formed in FIGS. 14 and 20. It will be appreciated by those skilled in the art that the final resonator structure formed according to the present invention will include a specific mesa structure if one is formed into the structure during the fabrication process. The quality factor or Q factor is a dimensionless parameter that describes how under-damped an oscillator or resonator is, or equivalently, characterizes a resonator's bandwidth relative to its center frequency. Higher Q indicates a lower rate of energy loss relative to the stored energy of the resonator; the oscillations die out more slowly. Resonators with high quality factors have low damping so that they ring longer.

Figure 15:
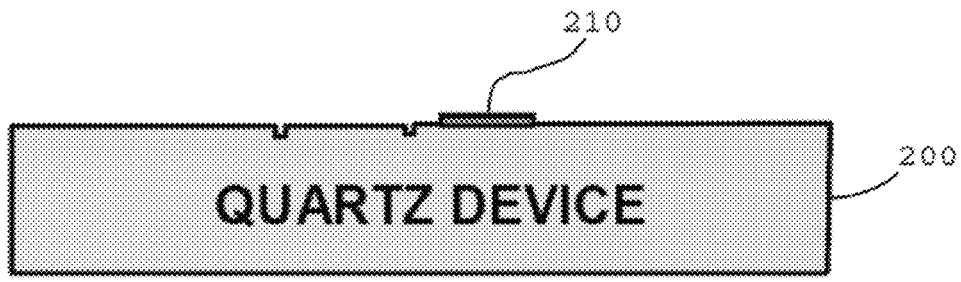
FIG. 15 shows a top-side metallization on the quartz device wafer to form an etch stop layer for the subsequent via etch.

As shown in FIG. 15, the fabrication continues with a top-side metallization on the quartz device wafer 200 to form an etch stop layer for the subsequent via etch. Metallization techniques are known in the art. The metal pad 210 consists of Cr, Ni and Au. Those skilled in the art will understand that other materials can be used for the metal pad.

Figure 16:
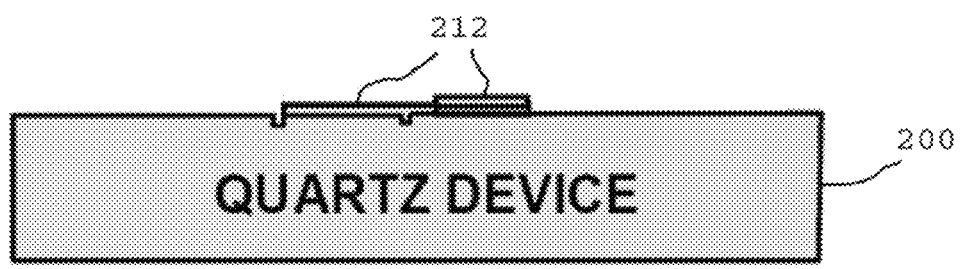
FIG. 16 shows a metal stack deposited to form the top side electrode.
Figure 17:
FIG. 17 shows an adhesive coated onto the handle wafer.

Referring to FIG. 16, another metal stack (e.g., Cr/Au) is deposited onto quartz device wafer 200 to form the top side electrode 212. FIG. 17 shows an adhesive 214 coated onto the handle wafer 202. Techniques for coating adhesive materials are known in the art. Exemplary materials used for the adhesive include a petroleum-based wax or a high temperature epoxy.

Figure 18:
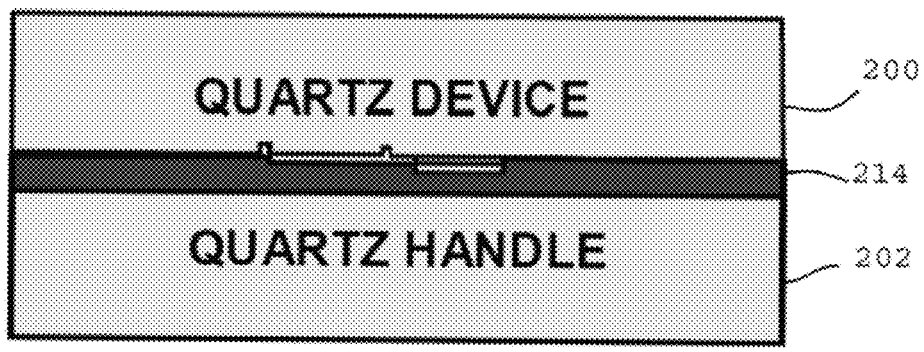
FIG. 18 shows the quartz device wafer flipped upside down and bonded to the handle.

As shown in FIG. 18, the quartz device wafer is then flipped upside down and bonded to the handle using a thermo-compression bond. Techniques for manipulating the wafers are known in the art.

Figure 19:
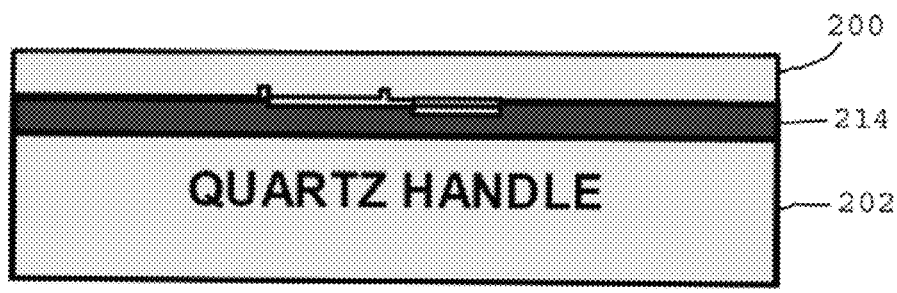
FIG. 19 shows the quartz device wafer thinned to a desired thickness.

The quartz device wafer 200 is subsequently thinned, as shown in FIG. 19, to a desired thickness to reflect the operating frequency using both wafer grinding and chemical mechanical planarization (CMP). Thinning techniques are known in the art. An exemplary thinning process is explained in detail in the incorporated patent.

Referring to FIG. 20, another plasma etch is performed to create the matching mesa structure 216 on the bottom side of the quartz device wafer 200 for energy confinement purpose.

Figure 21:
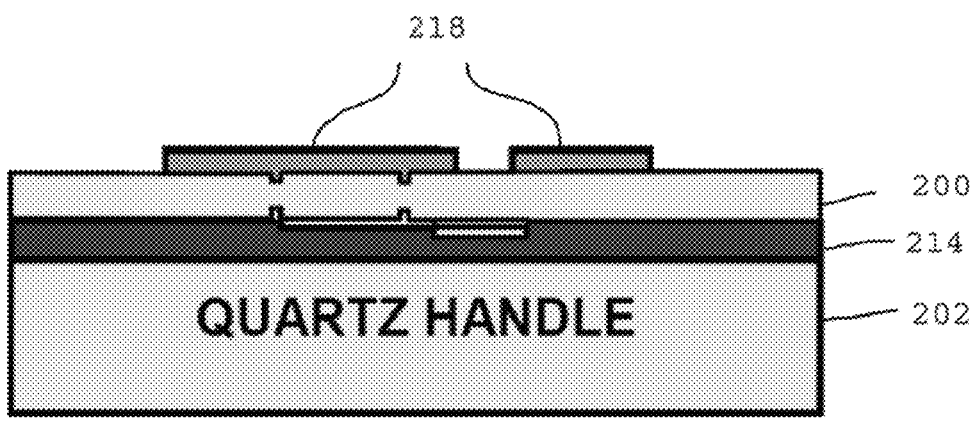
FIG. 21 shows a dry etch mask that has been deposited onto the quartz device wafer.
Figure 22:
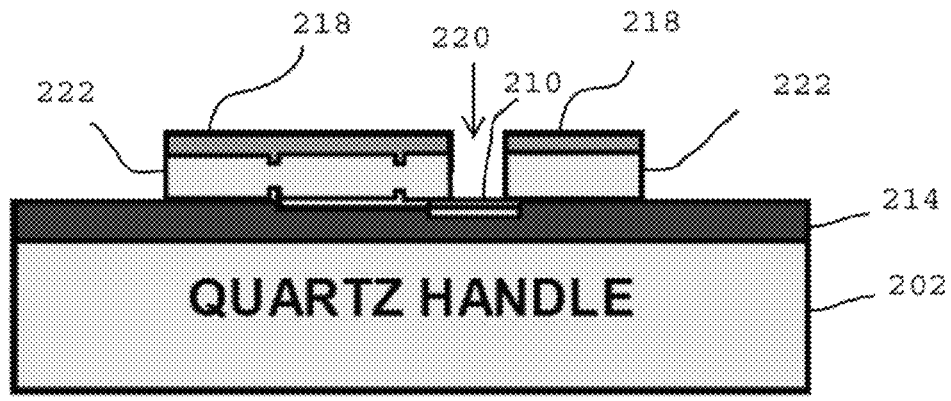
FIG. 22 shows the via and resonator sidewalls after an etching process has been carried out.
Figure 23:
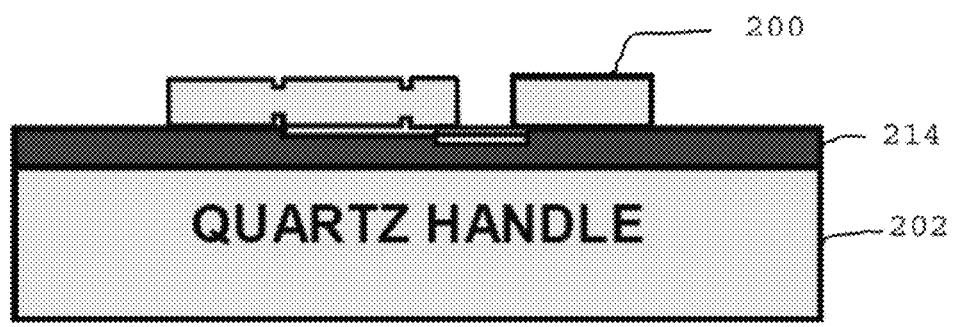
FIG. 23 shows the exposed quartz device wafer after the dry etch mask has been removed.
Figure 24:
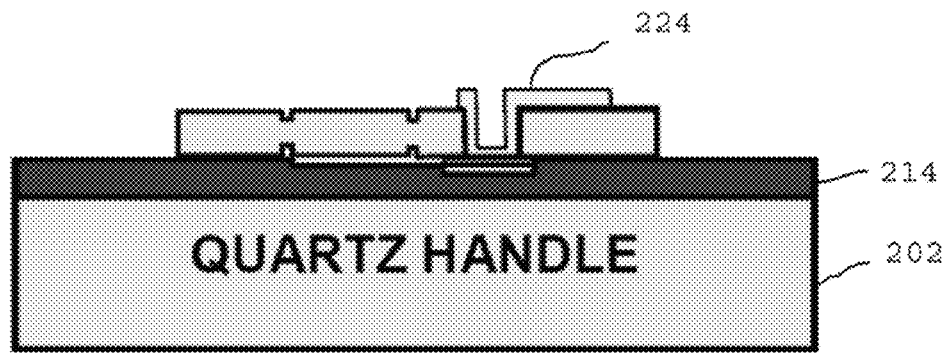
FIG. 24 shows a layer of Cr/Au conformally deposited and etched to form the resonator bond pads and via metal to connect to the top electrode.
Figure 25:
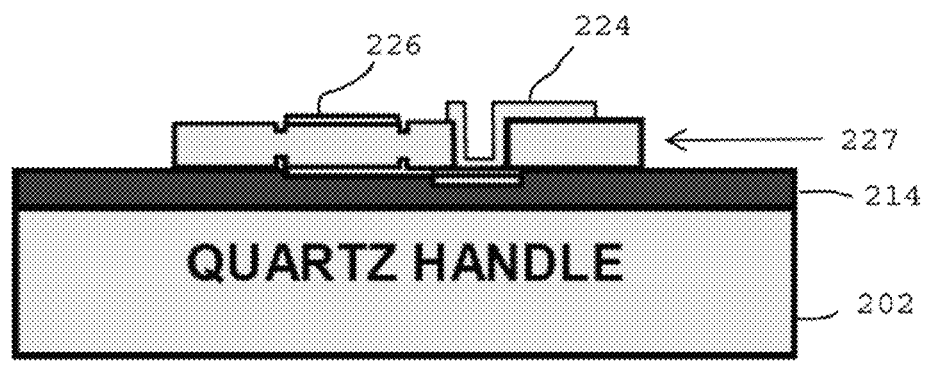
FIG. 25 shows another Cr/Au layer that has been deposited and patterned to form the bottom electrode of the quartz resonator.
Figure 26:
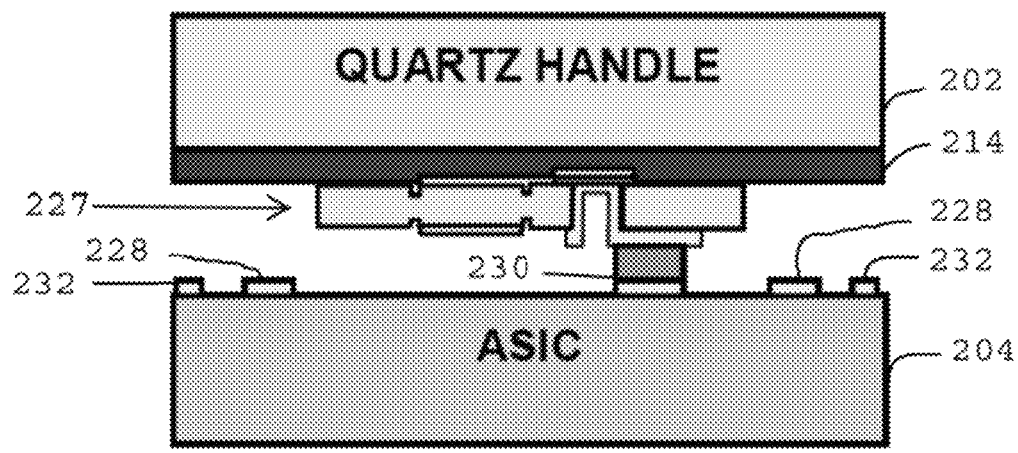
FIG. 26 shows the host wafer, where the pin-out probe pads, substrate bond pads and capping seal rings have been deposited.

As shown in FIG. 21, a dry etch mask 218 is then deposited onto quartz device wafer 200 to carry out a combined via and resonator plasma dry etch. The dry etch mask 218 can be formed of Al or Ni and is patterned on the bottom side of the quartz resonator to form the via and resonator openings. Note that FIG. 21 is a cross-sectional representation. A top view would reveal that the opening for the via is within the boundaries of a single portion of the dry etch mask 218. For example, a single circular opening in the dry etch mask could be provided to allow the via to be etched. The opening could take other shapes as well. Referring to FIG. 22, a fluorine-based plasma is then used to etch the via 220 and resonator sidewalls 222. The quartz device wafer is still a single piece of quartz and is sometimes referred to herein as the resonator body. As discussed above, the via would be an opening in the resonator body. The sidewalls of the resonator body can be vertical or angled. The Cr/Ni/Au etch stop layer (210 as also shown in FIG. 15) on the top side of the quartz device wafer will prevent the plasma from puncturing the top side electrode. As shown in FIG. 23, the Al or Ni dry etch mask 218 of FIGS. 21 and 22 has been stripped, leaving the quartz device wafer 200 exposed. FIG. 24 shows a layer 224 of Cr/Au conformally deposited and etched to form the resonator bond pads and via metal to connect to the top electrode. FIG. 25 shows another Cr/Au layer 226 that has been deposited and patterned to form the bottom electrode of the quartz resonator 227. FIG. 26 shows the host wafer 204, where pin-out probe pads 232, substrate bond pads 230 and capping seal rings 228 have been deposited with metal (e.g., Cr/Pt/Au or Cr/Pt/Au/In). Exemplary materials for use in the substrate bond pad include Au and Au/In. The quartz resonator can be joined to the ASIC with compression bonding. Note that the ASIC bond pad 230 is electrically connected to layer 224. Not shown in FIG. 26 is that layer 226 is connected to a separate ASIC bond pad. Thus, bond pad 230 is electrically connected to layer 224, which is connected to metallic etch stop 210 which is connected to electrode 212. Electrode 226 across the resonator body 227 from electrode 212, which is electrically connected to another bond pad on the ASIC. Thus, a voltage may be applied across the resonator body between electrode 226 and 212 to cause the resonator to vibrate. The quartz device/handle pair is then aligned and bonded to the host wafer with a metal-metal thermo-compression bond using a commercial wafer bonder. The bonded stack can be soaked in an appropriate solvent to dissolve the adhesive, thus freeing the resonators 227 from the handle wafer 202 and leaving them on the host wafer 204, as shown in FIG. 27. Again, the mesa structure shown in FIG. 27 is only provided as an example. It is within the scope and teachings of the present invention to provide a resonator that does not include a mesa structure. The invention contemplates the use of alternate mesa structures as well. Further, the particular form of the resonator as shown in FIG. 27 is provided as an example. Those skilled in the art will recognize that other resonator designs can be produced according to the teachings herein. The fully released devices are then baked in a vacuum oven to completely rid themselves of any residual solvent.

Figure 28:
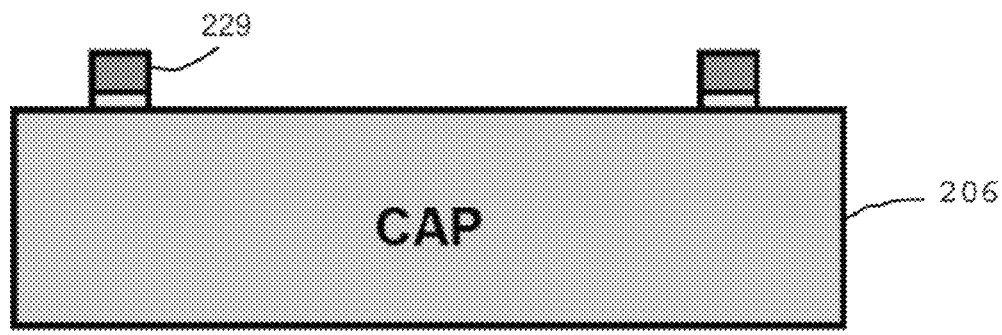
FIG. 28 shows the silicon cap wafer with a metal stack deposited to form the seal ring for hermetical sealing of the quartz resonator.
Figure 29:
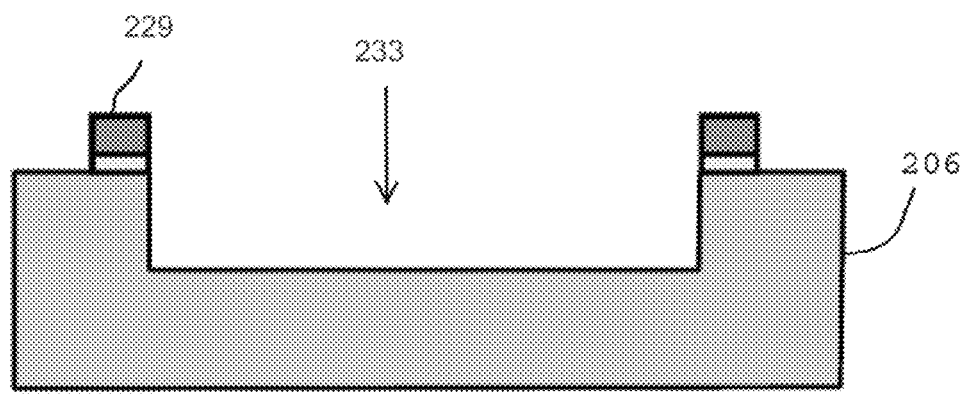
FIG. 29 shows a cavity formed in the cap layer to accommodate the quartz resonator on the host ASIC wafer.
Figure 30:
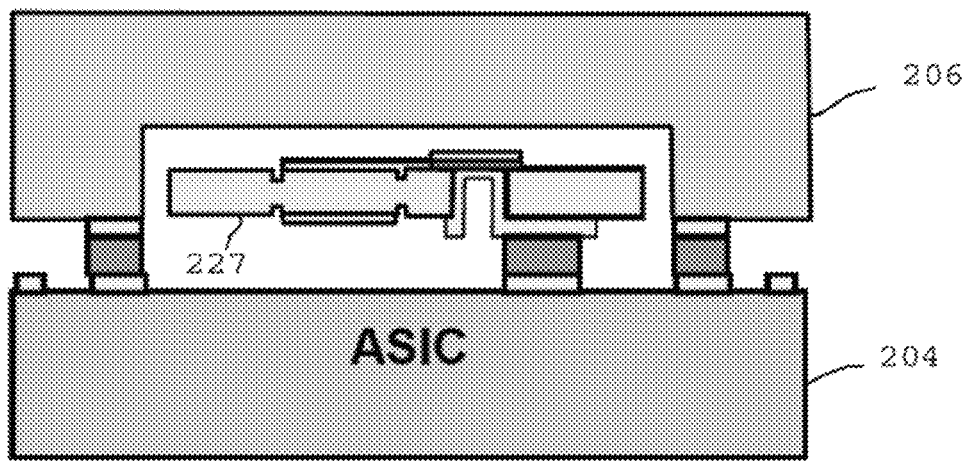
FIG. 30 shows the silicon cap bonded to the quartz oscillator wafer.
Figure 31:
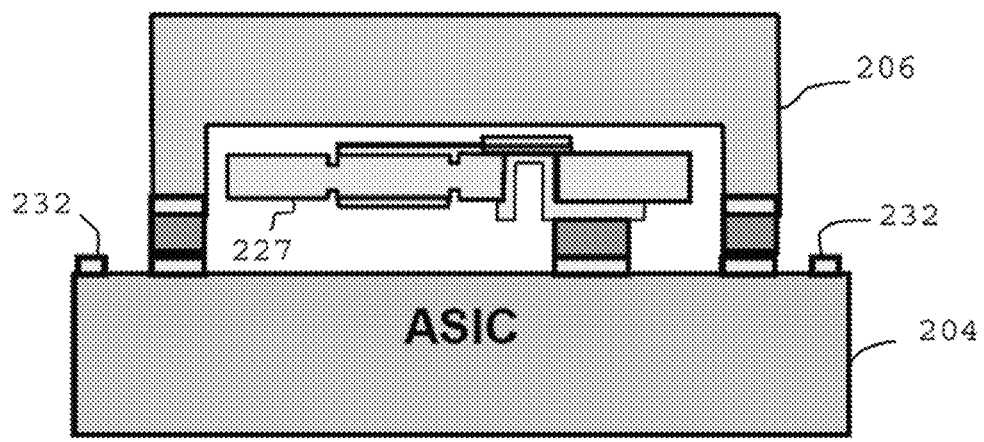
FIG. 31 shows the cap wafer after it has been etched for access to the pin-out pads.

Referring to FIG. 28, a metal stack (e.g., Cr/Pt/Au/In) is deposited on the silicon cap wafer 206 to form the seal ring 228 for hermetical sealing of the quartz resonator. FIGS. 28-31 show the seal ring 228 and cap wafer 206 in cross-section. Referring to FIG. 29, a silicon recess etch is performed to create a cavity 233 to accommodate the quartz resonator on the host ASIC wafer. Using a wafer bonder, the silicon cap 206 is bonded to the quartz oscillator wafer 204, as shown in FIG. 30. FIG. 31 shows the cap wafer 206 after it has been etched for access to the pin-out pads 232. FIG. 31 shows the cap wafer 206 and the ASIC 204 in cross section. The resonator 227 is fully enclosed within the boundaries of the cap wafer 206 and the ASIC 204.

Thus, an embodiment of the present invention provide a method for batch processing of miniaturized thickness-shear mode quartz resonators that operate at frequencies ranging from HF (3-30 MHz) to UHF (300 MHz-3 GHz). Quartz resonators are formed by bonding a quartz device wafer to a quartz handle wafer. This may be done with a temporary adhesive. Plasma dry etching is utilized to form arbitrary resonator geometries. The quartz resonator structure and the through-quartz vias are concurrently formed. Thermo-compression bonding is used to integrate quartz resonators to a host wafer (e.g., an oscillator ASIC) to form oscillators. Mesa structures formed, e.g., by plasma etching, enable resonators capable of high-Q operation with energy trapping/mode confinement by utilizing mesa structures formed by plasma dry etching. Wafer scale hermetic encapsulation of the quartz oscillators is achieved by bonding of silicon cap wafers.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

Broadly, this writing discloses at least the following. High-yield fabrication methods are provided for making quartz resonators having thicknesses ranging from one micrometer to several hundred micrometers and thus covering the frequency range from HF to UHF. Plasma dry etching is used to form arbitrary resonator geometries. The quartz resonator structure and the through-quartz vias are formed concurrently. The method includes bonding a quartz device wafer to a quartz handle wafer with a temporary adhesive. Mesa structures formed by plasma dry etching enable the resonators to achieve high-Q operation with energy trapping/mode confinement. A thermo-compression bond integrates the quartz resonators to a host wafer (e.g., an oscillator ASIC) to form oscillators. Silicon cap wafers are bonded over the resonators to the ASIC to provide wafer scale hermetic encapsulation of the quartz oscillators.

All elements, parts and steps described herein are preferably included. It is to be understood that any of these elements, parts and steps may be replaced by other elements, parts and steps or deleted altogether as will be obvious to those skilled in the art.

Concepts

This writing discloses at least the following concepts.

Concept 1. A method of fabricating a resonator comprising:

providing a first quartz substrate having a desired thickness;

forming a metallic etch stop on a portion of a first major surface of said first quartz substrate;

adhesively attaching, using a temporary adhesive, said first major surface of said first quartz substrate and said metallic etch stop formed thereon to a second quartz substrate;

applying a dry etch mask on said second major surface of said first quartz substrate, said dry etch mask including a first opening;

directing a dry etchant through said first opening to thereby etch a via through said first quartz substrate to said etch stop;

forming a metal electrode on a second major surface of said first quartz substrate, said metal electrode penetrating said via in said first quartz substrate to make ohmic contact with said metallic etch stop;

bonding said metal electrode formed on said second major surface of said first quartz substrate to a pad formed on a substrate that bears oscillator drive circuitry; and dissolving said temporary adhesive to thereby release said second quartz substrate from said first major surface of said first quartz substrate and said metallic etch stop.

Concept 2. The method of any one of Concepts 1, 4, 5, 6, 7, 8, 9, 10, 11, 12, 13, 14, 15, or 16, wherein said metallic etch stop forms an electrode on said first major surface of said first quartz substrate.

Concept 3. The method of any one of Concepts 1, 2, 4, 5, 6, 7, 8, 9, 10, 11, 12, 13, 14, 15, or 16, wherein said electrode on said first major surface of said first quartz substrate comprises layers of Cr and Au with the Cr layer is disposed closer to said first quartz substrate.

Concept 4. The method of any one of Concepts 1, 2, 3, 5, 6, 7, 8, 9, 10, 11, 12, 13, 14, 15, or 16, wherein the step of directing a dry etchant further comprises defining a perimeter shape of said first quartz substrate.

Concept 5. The method of any one of Concepts 1, 2, 3, 4, 6, 7, 8, 9, 10, 11, 12, 13, 14, 15, or 16, wherein said dry etchant comprises a fluorine-based plasma.

Concept 6. The method of any one of Concepts 1, 2, 3, 4, 5, 7, 8, 9, 10, 11, 12, 13, 14, 15, or 16, wherein a plurality of resonators are formed simultaneously from a single first quartz substrate, the first quartz substrate having a plurality of metallic etch stops, each said etch stop being each formed on a portion of the first major surface of the first quartz substrate, said portion aligning with each one of said resonators for each one of said metallic etch stops.

Concept 7. The method of any one of Concepts 1, 2, 3, 4, 5, 6, 8, 9, 10, 11, 12, 13, 14, 15, or 16, wherein a second metallic electrode is formed on a second major surface of said first quartz substrate opposing said metallic etch stop formed on said first major surface of said first quartz substrate, said second metallic electrode and said first mentioned metallic electrode being electrically isolated and physically spaced from each other.

Concept 8. The method of any one of Concepts 1, 2, 3, 4, 5, 6, 7, 9, 10, 11, 12, 13, 14, 15, or 16, wherein said first quartz substrate and said second quartz substrate are crystalline quartz.

Concept 9. The method of any one of Concepts 1, 2, 3, 4, 5, 6, 7, 8, 10, 11, 12, 13, 14, 15, or 16, wherein said first quartz substrate and said second quartz substrate are crystalline quartz and share a common crystal orientation.

Concept 10. The method of any one of Concepts 1, 2, 3, 4, 5, 6, 7, 8, 9, 11, 12, 13, 14, 15, or 16, wherein prior to the step of forming a metallic etch stop, the method further comprises etching a first mesa on said first major surface of said first quartz substrate.

Concept 11. The method of any one of Concepts 1, 2, 3, 4, 5, 6, 7, 8, 9, 10, 12, 13, 14, 15, or 16, wherein prior to the step of dry etching a via through said first quartz substrate to said etch stop, the method further comprises etching a second mesa in said second major surface of said first quartz substrate.

Concept 12. The method of Concept 11, wherein said first mesa is directly across said quartz wafer from said second mesa.

Concept 13. The method of any one of Concepts 1, 2, 3, 4, 5, 6, 7, 8, 9, 10, 11, 12, 14, 15, or 16, wherein the temporary adhesive is a petroleum-based wax.

Concept 14. The method of any one of Concepts 1, 2, 3, 4, 5, 6, 7, 8, 9, 10, 11, 12, 13, 15, or 16, wherein said etch stop comprises layers of Cr and Au with the Cr layer disposed closer to said first quartz substrate.

Concept 15. The method of any one of Concepts 1, 2, 3, 4, 5, 6, 7, 8, 9, 10, 11, 12, 13, 14, or 16, further comprising attaching a silicon cap to said substrate that bears oscillator drive circuitry, wherein said silicon cap comprises a cavity, wherein said cavity is facing said substrate that bears oscillator drive circuitry such that a chamber is produced, wherein said first quartz substrate is enclosed within said chamber.

Concept 16. The method of Concept 15, wherein said substrate that bears oscillator drive circuitry includes a capping seal ring comprising a first metal stack selected from the group consisting of Cr/Pt/Au and Cr/Pt/Au/In), wherein said silicon cap comprises a second metal stack comprising Cr/Pt/Au/In, wherein said first metal stack is bonded to said second metal stack.

Concept 17. An apparatus, comprising:

a silicon application-specific integrated circuit (ASIC) wafer comprising a first bond pad and a second bond pad;

a quartz resonator comprising a first side, a second side opposite said first side, a via, a first electrode, a second electrode and a third electrode, wherein said first electrode is on said first side and overlaps said via, wherein said second electrode is on said second side, extends into said via and is in electrical contact with said first electrode, wherein said second electrode is in electrical contact with said first bond pad, and wherein said third electrode is on said second side and is in electrical contact with said second bond pad; and a first mesa located on said first side and a second mesa located on said second side.

Concept 18. The apparatus of concept 17, further comprising a silicon cap attached to said ASIC, wherein said silicon cap comprises a cavity, wherein said cavity is facing said ASIC such that a chamber is produced, wherein said resonator is enclosed within said chamber.

Concept 19. The apparatus of concept 17, wherein said ASIC includes a capping seal ring comprising a first metal stack selected from the group consisting of Cr/Pt/Au and Cr/Pt/Au/In), wherein said silicon cap comprises a second metal stack comprising Cr/Pt/Au/In, wherein said first metal stack is bonded to said second metal stack.

Concept 20. An apparatus, comprising:
a quartz resonator body comprising a first side, a second side and a via;
a silicon ASIC wafer comprising an electrically conductive first bond pad and an electrically conductive second bond pad;
a first electrode overlapping said via on said first side;
a contiguous metal portion on said second side and extending into said via such that said contiguous metal portion makes electrical contact with said first electrode;
a second electrode on said second side, wherein said contiguous metal portion is connected to said first electrically conductive bond pad and wherein said second electrode is connected to said second electrically conductive bond pad;
a first mesa on said first side; and
a second mesa on said second side.

Concept 21. The apparatus of Concept 20, further comprising a silicon cap attached to said silicon ASIC, wherein said silicon cap comprises a cavity, wherein said cavity is facing said s silicon ASIC such that a chamber is produced, wherein said resonator is enclosed within said chamber.

Concept 22. The apparatus of Concept 21, wherein said silicon ASIC includes a capping seal ring comprising a first metal stack selected from the group consisting of Cr/Pt/Au and Cr/Pt/Au/In), wherein said silicon cap comprises a second metal stack comprising Cr/Pt/Au/In, wherein said first metal stack is bonded to said second metal stack.

Concept 23. A method of fabricating a resonator, comprising:
providing a silicon application-specific integrated circuit (ASIC) wafer comprising a first bond pad and a second bond pad;
providing a quartz resonator comprising a first side, a second side opposite said first side, a via, a first electrode, a second electrode and a third electrode, wherein said first electrode is on said first side and overlaps said via, wherein said second electrode is on said second side, extends into said via and is in electrical contact with said first electrode, wherein said second electrode is in electrical contact with said first bond pad, and wherein said third electrode is on said second side and is in electrical contact with said second bond pad, wherein said via is formed by a dry etching process; and providing a first mesa located on said first side and a second mesa located on said second side.

Concept 24. The method of Concept 23, further comprising attaching a silicon cap to said ASIC, wherein said silicon cap comprises a cavity, wherein said cavity is facing said ASIC such that a chamber is produced, wherein said quartz resonator is enclosed within said chamber.

Concept 25. The method of Concept 24, wherein said ASIC includes a capping seal ring comprising a first metal stack selected from the group consisting of Cr/Pt/Au and Cr/Pt/Au/In), wherein said silicon cap comprises a second metal stack comprising Cr/Pt/Au/In, wherein said first metal stack is bonded to said second metal stack.

We claim:
1. A method of fabricating a resonator comprising:
providing a first quartz substrate having a desired thickness;
providing a first mesa located on a first major surface of said first quartz substrate, said first mesa being defined by forming a first groove into said first side so that said first mesa is at least partially surrounded by material having the same thickness relative to said first groove as said first mesa but positioned laterally of said first mesa and separated therefrom by said first groove;
forming a metallic etch stop on a portion of the first major surface of said first quartz substrate;
forming a first metallic electrode on said first mesa of said first quartz substrate, in contact with said metallic etch stop and filling at least a portion of said first groove;
adhesively attaching, using a temporary adhesive, said first major surface of said first quartz substrate and said metallic etch stop formed thereon to a second quartz substrate;
applying a metallic etch mask on a second major surface of said first quartz substrate, said metallic etch mask including a first opening;
directing a dry etchant through said first opening to thereby dry etch a via having a vertical sidewall through said first quartz substrate to said etch stop;
conformally depositing a metal electrode on a second major surface of said first quartz substrate, on the vertical sidewall of said via and on a bottom of said via thereby making ohmic contact with said metallic etch stop;
bonding said metal electrode formed on said second major surface of said first quartz substrate to a pad formed on a substrate that bears oscillator drive circuitry; and
dissolving said temporary adhesive to thereby release said second quartz substrate from said first major surface of said first quartz substrate and said metallic etch stop.

2. The method of claim 1, wherein said first electrode on said first major surface of said first quartz substrate comprises layers of Cr and Au with the Cr layer is disposed closer to said first quartz substrate.

3. The method of claim 1, wherein the step of directing an etchant further comprises defining a perimeter shape of said first quartz substrate.

4. The method of claim 3, wherein said etchant comprises a fluorine-based plasma.

5. The method of claim 1, wherein a plurality of resonators are formed simultaneously from a single first quartz substrate, the first quartz substrate having a plurality of metallic etch stops, each said etch stop being each formed on a portion of the first major surface of the first quartz substrate, said portion aligning with each one of said resonators for each one of said metallic etch stops.

6. The method of claim 1, further including providing a second mesa located on the second major surface of said first quartz substrate, said second mesa being defined by forming a second groove into said second side so that said second mesa is at least partially surrounded by material having the same thickness relative to said second groove as said second mesa but positioned laterally of said second mesa and separated therefrom by said first groove, and forming a second metallic electrode on the second mesa.

7. The method of claim 1, wherein said first quartz substrate and said second quartz substrate are crystalline quartz.

8. The method of claim 1, wherein said first quartz substrate and said second quartz substrate are crystalline quartz and share a common crystal orientation.

9. The method of claim 1, wherein prior to the step of forming a metallic etch stop, the method further comprises dry etching the first mesa on said first major surface of said first quartz substrate, the first mesa having a central plateau region and having at least one vertical sidewall defining an exterior edge of the plateau region of said first mesa.

10. The method of claim 9, wherein prior to the step of dry etching a via through said first quartz substrate to said etch stop, the method further comprises dry etching a second mesa in said second major surface of said first quartz substrate, the second mesa having a central plateau region and having at least one vertical sidewall defining an exterior edge of the plateau region of said second mesa.

11. The method of claim 10, wherein said first mesa is directly across said quartz wafer from said second mesa.

12. The method of claim 1, wherein the temporary adhesive is a petroleum-based wax.

13. The method of claim 1, wherein said etch stop comprises layers of Cr and Au with the Cr layer disposed closer to said first quartz substrate.

14. The method of claim 1, further comprising attaching a silicon cap to said substrate that bears oscillator drive circuitry, wherein said silicon cap comprises a cavity, wherein said cavity is facing said substrate that bears oscillator drive circuitry such that a chamber is produced, wherein said first quartz substrate is enclosed within said chamber.

15. The method of claim 14, wherein said substrate that bears oscillator drive circuitry includes a capping seal ring comprising a first metal stack selected from the group consisting of Cr/Pt/Au and Cr/Pt/Au/In, wherein said silicon cap comprises a second metal stack comprising Cr/Pt/Au/In, wherein said first metal stack is bonded to said second metal stack.

16. The method of claim 1, wherein the temporary adhesive has a thickness sufficient to accommodate a thickness of said metallic etch stop.

17. An apparatus, comprising:
a silicon application-specific integrated circuit (ASIC) wafer comprising a first bond pad and a second bond pad;
a quartz resonator comprising a first side, a second side opposite said first side, a via, a first electrode, a second electrode and a third electrode, wherein said first electrode is on said first side and overlaps said via, wherein said second electrode is on said second side, extends into said via and is in electrical contact with said first electrode, wherein said second electrode is in electrical contact with said first bond pad, and wherein said third electrode is on said second side and is in electrical contact with said second bond pad; and
a first mesa located on said first side and a second mesa located on said second side, the first mesa being defined by a first pair of vertical sidewalls in said quartz resonator which define a groove in said first side, the second mesa being defined by a second pair of vertical sidewalls in said quartz resonator which define a groove in said second side, the first and second pairs of vertical sidewalls vertically aligning with each other on opposing sides of said quartz resonator, the groove in said first side being at least partially filled by said first electrode and wherein said ASIC includes a capping seal ring comprising a first metal stack selected from the group consisting of Cr/Pt/Au and Cr/Pt/Au/In, wherein a silicon cap comprises a second metal stack comprising Cr/Pt/Au/In, and wherein said first metal stack is bonded to said second metal stack.

18. The apparatus of claim 17, wherein said silicon cap is attached to said ASIC, wherein said silicon cap comprising a cavity, wherein said cavity is facing said ASIC such that a chamber is produced, wherein said resonator is enclosed within said chamber.

19. An apparatus, comprising:
a quartz resonator body comprising a first side, a second side and a via;
a silicon ASIC wafer comprising an electrically conductive first bond pad and an electrically conductive second bond pad;
a first electrode overlapping said via on said first side;
a contiguous metal portion on said second side and extending into said via such that said contiguous metal portion makes electrical contact with said first electrode;
a second electrode on said second side, wherein said contiguous metal portion is connected to said first electrically conductive bond pad and wherein said second electrode is connected to said second electrically conductive bond pad;
a first mesa on said first side defined by a first groove formed into said first side so that said first mesa is at least partially surrounded by material having the same thickness relative to said first groove as said first mesa but positioned laterally of said first mesa and separated therefrom by said first groove; and
a second mesa on said second side defined by a second groove formed into said second side so that said second mesa is at least partially surrounded by material having the same thickness relative to said second groove as said second mesa but positioned laterally of said second mesa and separated therefrom by said second groove, and wherein said first electrode also fills a portion of said first groove.

20. The apparatus of claim 19, further comprising a silicon cap attached to said silicon ASIC, wherein said silicon cap comprises a cavity, wherein said cavity is facing said s silicon ASIC such that a chamber is produced, wherein said resonator is enclosed within said chamber.

21. An apparatus, comprising:
a quartz resonator body comprising a first side, a second side and a via;
a silicon ASIC wafer comprising an electrically conductive first bond pad and an electrically conductive second bond pad;
a silicon cap;
a first mesa defined by a first groove in said first side;
a second mesa defined by a second groove in said second side;

a first electrode overlapping said via and filling a portion of said first groove on said first side;

a contiguous metal portion on said second side and extending into said via such that said contiguous metal portion makes electrical contact with said first electrode;

a second electrode on said second side, wherein said contiguous metal portion is connected to said first electrically conductive bond pad and wherein said second electrode is connected to said second electrically conductive bond pad; and wherein said silicon ASIC includes a capping seal ring comprising a first metal stack selected from the group consisting of Cr/Pt/Au and Cr/Pt/Au/In, wherein said silicon cap comprises a second metal stack comprising Cr/Pt/Au/In, wherein said first metal stack is bonded to said second metal stack.

22. A method of fabricating a resonator, comprising:

providing a silicon application-specific integrated circuit (ASIC) wafer comprising a first bond pad and a second bond pad;

providing a quartz resonator comprising a first side, a second side opposite said first side, a via, a first electrode, a second electrode and a third electrode, wherein said first electrode is on said first side and overlaps said via, wherein said second electrode is on said second side, extends into said via and is in electrical contact with said first electrode, wherein said second electrode is in electrical contact with said first bond pad, and wherein said third electrode is on said second side and is in electrical contact with said second bond pad, wherein said via is formed by a dry etching process; and providing a first mesa located on said first side, said first mesa being defined by forming a first groove into said first side so that said first mesa is at least partially surrounded by material having the same thickness relative to said first groove as said first mesa but positioned laterally of said first mesa and separated therefrom by said first groove;

providing a second mesa located on said second side, said second mesa being defined by forming a second groove into said second side so that said second mesa is at least partially surrounded by material having the same thickness relative to said second groove as said second mesa but positioned laterally of said second mesa and separated therefrom by said first groove, the first and second groves increasing the quality factor (Q) of the resonator being fabricated; and providing a first electrode on said first mesa and providing a second electrode on said second mesa, the first electrode filling a portion of said first groove.

23. The method of claim 22, further comprising attaching a silicon cap to said ASIC, wherein said silicon cap comprises a cavity, wherein said cavity is facing said ASIC such that a chamber is produced, wherein said quartz resonator is enclosed within said chamber.

24. The method of claim 23, wherein said ASIC includes a capping seal ring comprising a first metal stack selected from the group consisting of Cr/Pt/Au and Cr/Pt/Au/In, wherein said silicon cap comprises a second metal stack comprising Cr/Pt/Au/In, wherein said first metal stack is bonded to said second metal stack.

25. A method of fabricating a resonator comprising:

providing a first quartz substrate;

forming a metallic etch stop on a portion of a first major surface of the first quartz substrate;

adhesively attaching, using a temporary adhesive, the first major surface of the first quartz substrate and the metallic etch stop formed thereon to a second quartz substrate, the temporary adhesive having a thickness sufficient to accommodate a thickness of said metallic etch stop;

applying an etch mask on a second major surface of said first quartz substrate, said etch mask including a first opening;

etching through said first opening to thereby etch a via through said first quartz substrate to said metallic etch stop and etching the first substrate to define the bar of the vibrating bar resonator from said first quartz substrate;

forming a metal electrode on a second major surface of the first quartz substrate, the metal electrode penetrating the via in the first quartz substrate to make ohmic contact with the metallic etch stop;

bonding the metal electrode formed on the second major surface of the first quartz substrate to a pad formed on a substrate bearing oscillator drive circuitry to form a bond there between; and dissolving the temporary adhesive to thereby release the second quartz substrate from the substrate bearing oscillator drive circuitry and a portion of the first quartz substrate bonded thereto via the bond formed between the metal electrode formed on the second major surface of the first quartz substrate to and the pad formed on the substrate bearing oscillator drive circuitry.

\* \* \* \* \*